United States Patent [19]
Huang et al.

[11] Patent Number: 5,668,392
[45] Date of Patent: Sep. 16, 1997

[54] LOW CAPACITANCE AND LOW $V_T$ ANNULAR MOSFET DESIGN FOR PHASE LOCK LOOP APPLICATIONS

[75] Inventors: Chuck Huang, San Jose; Chune-Sin Yeh, Santa Clara, both of Calif.

[73] Assignee: National Semiconductor Corporation, Santa Clara, Calif.

[21] Appl. No.: 738,538

[22] Filed: Oct. 28, 1996

[51] Int. Cl.⁶ ............................................ H01L 23/58
[52] U.S. Cl. .................. 257/340; 257/401; 257/412; 257/413; 257/488
[58] Field of Search ............................. 257/401, 412, 257/413, 488, 340

[56] References Cited

U.S. PATENT DOCUMENTS 3,821,776  6/1974  Hayashi et al. ............... 257/340 X
4,288,806  9/1981  Ronen ........................... 257/401 X
5,200,637  4/1993  Matsuo et al. ................ 257/401 X

FOREIGN PATENT DOCUMENTS 2283071  11/1990  Japan ............................. 257/401

Primary Examiner—William Mintel
Attorney, Agent, or Firm—Limbach & Limbach L.L.P.

[57] ABSTRACT

Low capacitance, low threshold voltage annular MOSFET transistors are disclosed. Both low junction capacitance and low threshold voltage are achieved without degradation of drain current due to application of back-bias to the substrate upon which the transistor is formed. A polysilicon annulus, rather than the drain region, abuts field oxide regions, thereby preventing junction capacitance at interface of field oxide and drain (or source). Annular MOSFETs can be fabricated using conventional CMOS processing technology.

12 Claims, 7 Drawing Sheets

LOW CAPACITANCE AND LOW $V_T$ ANNULAR MOSFET DESIGN FOR PHASE LOCK LOOP APPLICATIONS

BACKGROUND OF THE INVENTION

1. Field of the Invention

The present invention relates to MOSFETs having low junction capacitance and low threshold voltage and that are especially suitable for high frequency applications. More particularly, the present invention relates to annular MOSFETs for phase lock loop applications.

2. Description of the Related Art

A conventional transistor 10 fabricated using CMOS technology has a straight polysilicon gate electrode 12 and rectangular doped drain and source regions 14, 16 diffused on either side of gate 12. A typical layout is shown in FIGS. 1 and 1A. The disadvantages of such MOSFETs include junction capacitance from source or drain to field oxide regions 20 because of the relatively high dopant concentration due to field implant and leakage current from the drain to the source along the edges of the drain and source regions.

Annular transistor layouts 24, such as shown in FIGS. 2 and 2A, are also known. In this configuration, gate 12, drain 14 and source 16 are circular. In annular transistors 24, although the drain to source path does not border field oxide regions 26, the drain ring 14 does and this leads to undesirably high junction capacitance.

Threshold voltage $V_T$, i.e., the gate voltage necessary to form a conductive channel for electrons, that is, to turn on the transistor, is an important design parameter for transistors. $V_T$ increases with increasing source to substrate bias voltage; the mechanism of this so-called "back-bias" effect is that the gate charge must first compensate for bulk charge existing on the substrate side of the channel before creating a conductive channel. Drain current $I_D$ is also affected by channel conductivity. Since higher $I_D$ is desirable because of the resulting increased device speed, it is desired to improve channel conductivity and achieve higher mobility.

SUMMARY OF THE INVENTION

The present invention resolves these and other problems in the prior art by providing low capacitance, low $V_T$ annular MOSFET transistors having an outside polysilicon annulus or ring. Transistors according to the present invention are fabricated with reduced $V_T$ threshold implant (compared to that used for conventional transistors), whereby the target $V_T$ is obtained with a back-bias. Both low junction capacitance and low $V_T$ are accomplished without degradation of drain current due to back-bias. In fact, drain current tends to increase as a result of improved mobility due to the relatively lower $V_T$ threshold implant.

In one aspect, annular transistors according to the present invention include a source formed in a semiconductor substrate, a drain spaced from and concentric with the source in the substrate and having an annular shape, thereby forming a channel with the source, a polysilicon gate electrode having an annular shape, the inner circumference of which overlies the source and the outer circumference of which overlies the drain and a polysilicon annulus for isolating the drain from field oxide regions, wherein an inner circumference of the polysilicon annulus overlies an outer circumference of the drain. A targeted gate threshold voltage may be achieved by application of a back-bias to the semiconductor substrate without degrading transistor performance, e.g., drain current.

Annular transistors according to the present invention may be circular, rectangular or other geometric configuration.

BRIEF DESCRIPTION OF THE DRAWINGS

The present invention will be better understood by reference to the following figures, in which like reference numerals refer to the same element and in which.

DESCRIPTION OF THE INVENTION

Annular transistors of the present invention are described with reference to FIGS. 3, 4, 4A and 5. Although, for convenience, these transistors are described herein using the terms "annular" or "ring," neither of these terms is intended to limit the structures discussed to circular structures; as will be seen below, other configurations are possible and are considered within the scope of the present invention.

Figure 1:
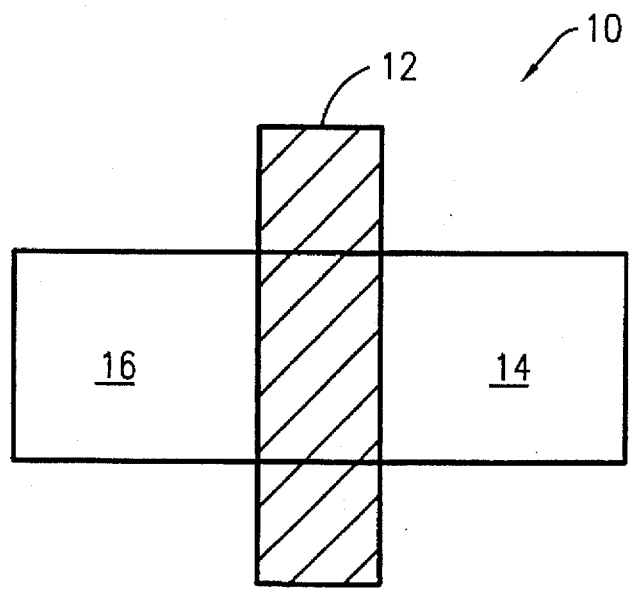
FIGS. 1 and 1A are plan and cross-sectional views, respectively, of conventional MOSFET transistors.
Figure 1A:
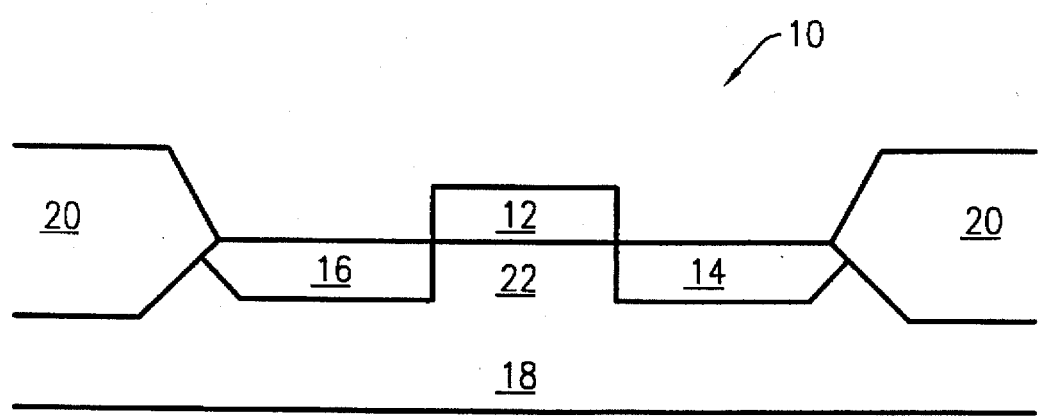
Figure 2:
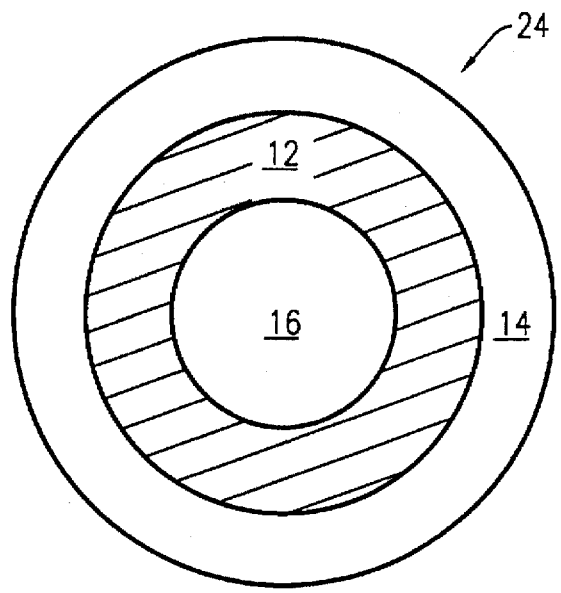
FIGS. 2 and 2A are plan and cross-sectional views of conventional annular transistors.
Figure 2A:
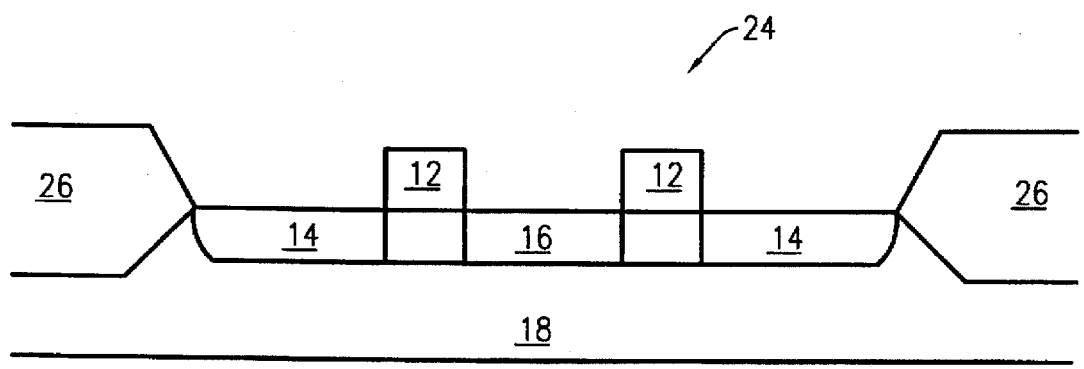
Figure 4:
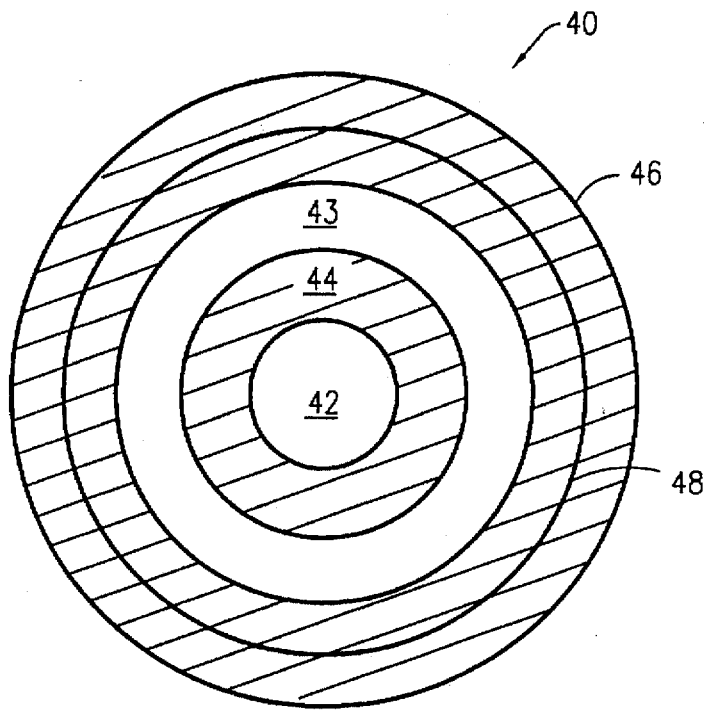
FIGS. 4 and 4A illustrate plan and cross-sectional views, respectively, of annular transistors according to the present invention.
Figure 4A:
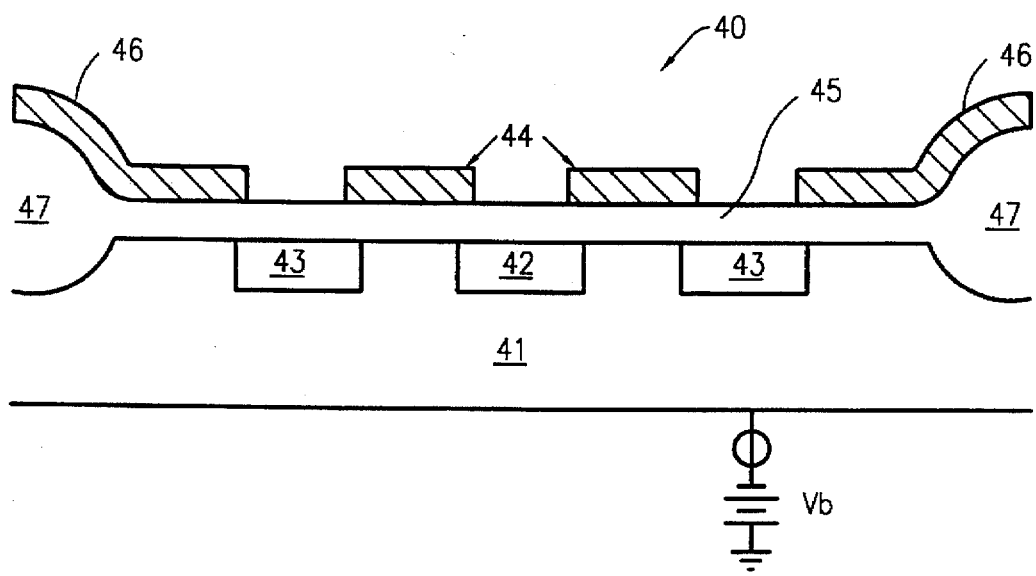

FIGS. 3, 4, 4A and 5 illustrate exemplary annular transistor configurations according to the present invention. The following detailed description of FIGS. 4 and 4A is equally applicable to FIGS. 3 and 5 as well.

As can be seen in FIGS. 4 and 4A, a circular annular transistor 40 according to the present invention may be formed on substrate 41 and includes a source 42 and drain 43. Drain 43 encircles source 42. Polysilicon gate 44 and gate oxide layer 45, also annular, overlie source 42 and drain 43. Polysilicon ring 46 forms the outermost annulus, abutting field oxide regions 47 beyond the active area of the device defined as region 48. Polysilicon ring 46 outside of drain region 43 prevents source 42 and drain 43 from "seeing" field oxide regions 47. Such an annular configuration prevents junction capacitance at the interface between source and drain regions, on the one hand, and field oxide regions, on the other hand. Although junction capacitance to the channel may exist, it is considerably smaller in magnitude (×0.3) than the junction capacitance to the field oxide regions. As a result, no junction capacitance between either source 42 or drain 43 and field oxide regions 47 exists. The only junction capacitance is that between source 42 and drain 43 and the channel therebetween.

Figure 3:
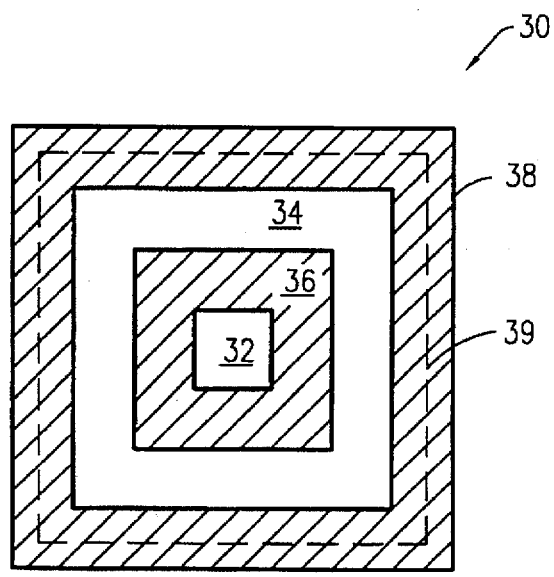
FIG. 3 illustrates a plan view of one embodiment of an annular transistor according to the present invention.
Figure 5:
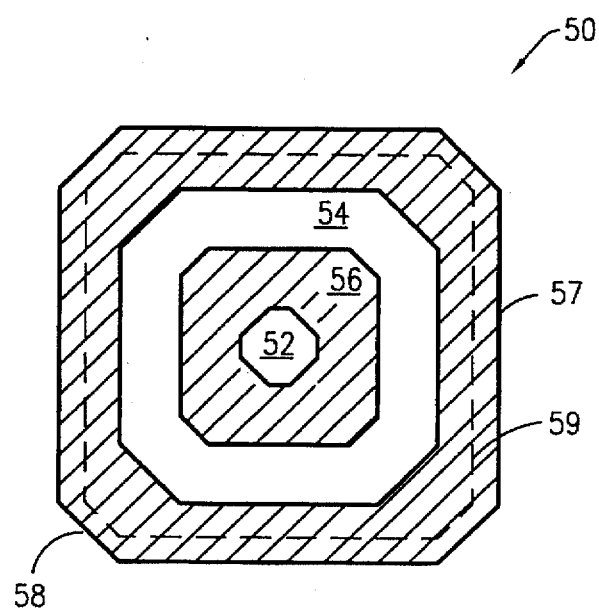
FIG. 5 illustrates an annular transistor of configuration without sharp corners according to the present invention.

As shown in FIGS. 3 and 5, transistors according to the present invention are generally annular, if not circular, as the transistors of FIGS. 4 and 4A. Specifically, FIG. 3 illustrates a square annular transistor 30 having a source region 32, drain 34 having a common center with (i.e., is concentric with the source) source 32, polysilicon gate electrode 36 and polysilicon ring 38 abutting field oxide regions beyond the active area of the device defined as region 39. Similarly, FIG. 5 illustrates an annular transistor 50 having a source region 52, drain region 54, polysilicon gate electrode 56 and polysilicon ring 57 abutting field oxide regions beyond the active area of the device defined as region 59. Each of these elements approximates a square, except that all corners, e.g., corners 58 of polysilicon ring 57, are "cut off" or somewhat rounded compared to square annular transistor 30.

Annular transistors according to the present invention may be fabricated with conventional CMOS technology. The following description refers to FIGS. 4 and 4A, but is generally applicable to FIGS. 3 and 5. Generally, after an n-well or p-well is formed in a p-substrate, a composite layer mask is used to define the device active area. Field oxide regions 47 are grown. A gate oxide 45 is then grown to about 80 Å thickness. A polysilicon layer is deposited over the gate oxide, masked and patterned to form the polysilicon gate 44 and the outermost polysilicon ring 46. The source and drain regions 42, 43 are then implanted. Thereafter, conventional CMOS processing may be carried out and may include deposition of CVD oxide, formation of metal interconnects and passivation.

Threshold voltage, $V_T$, as previously discussed, determines the ease with which the channel becomes conductive and therefore device speed. In annular transistors according to the present invention, $V_T$ is reduced such that the traget $V_T$ is achieved at the specified back bias.

For example, assuming a NMOS device in which the circuit to be operated at 1 volt with a target $V_T$ of 0.5 volts, $V_T$ implant dosage was adjusted so that $V_T$ values were 0.5 volts and 0.3 volts, respectively, with and without a back-bias of 1 volt.

In annular transistors according to the present invention, neither $V_T$ nor drain current is degraded by application of back-bias $V_b$ during transistor operation. In fact, the drain current would be improved as a result of the mobility improvement due to the low channel concentration achieved by reducing the $V_T$ implant.

Figure 6:
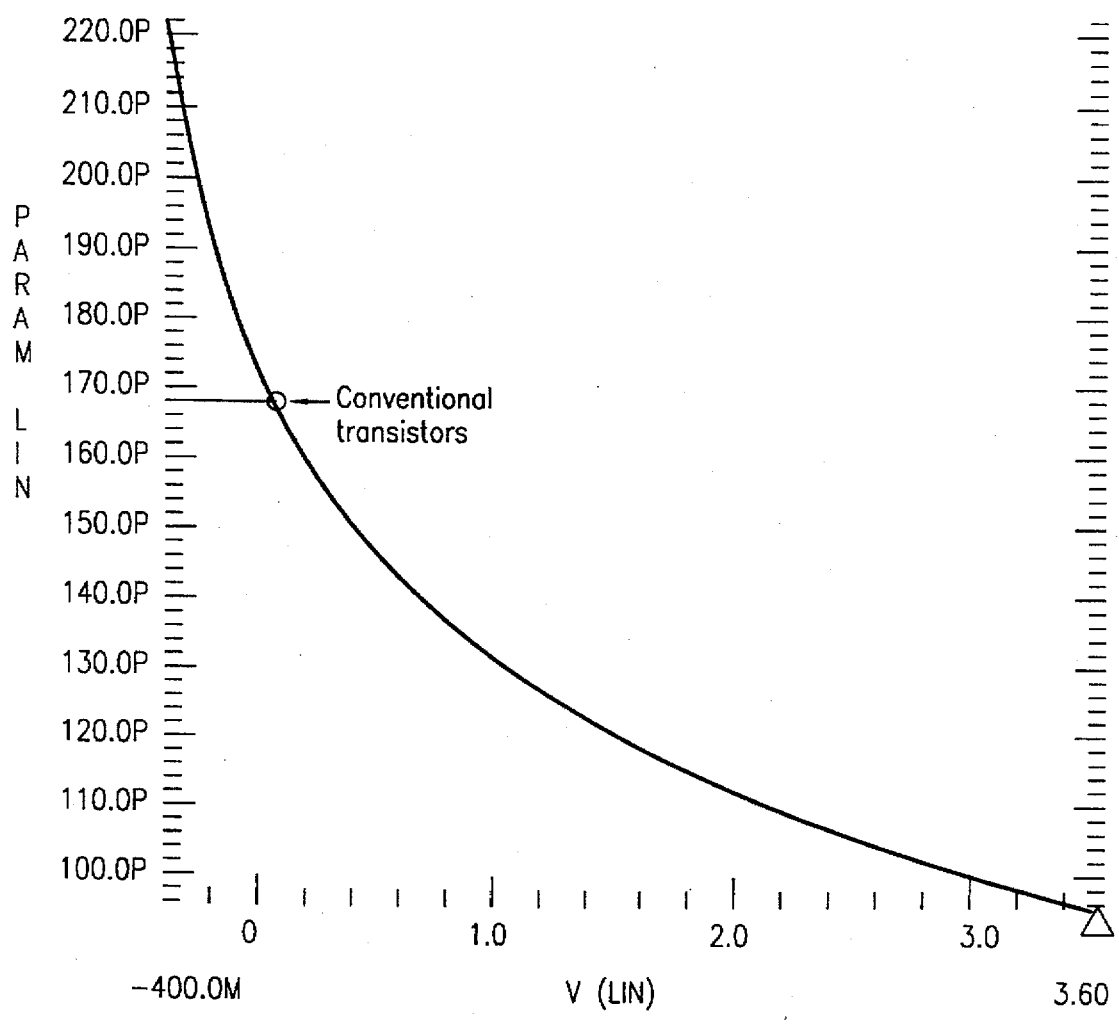
FIGS. 6 and 7 are graphs of the finger junction capacitance of annular transistors according to the present invention and that of prior art transistors, respectively.
Figure 7:
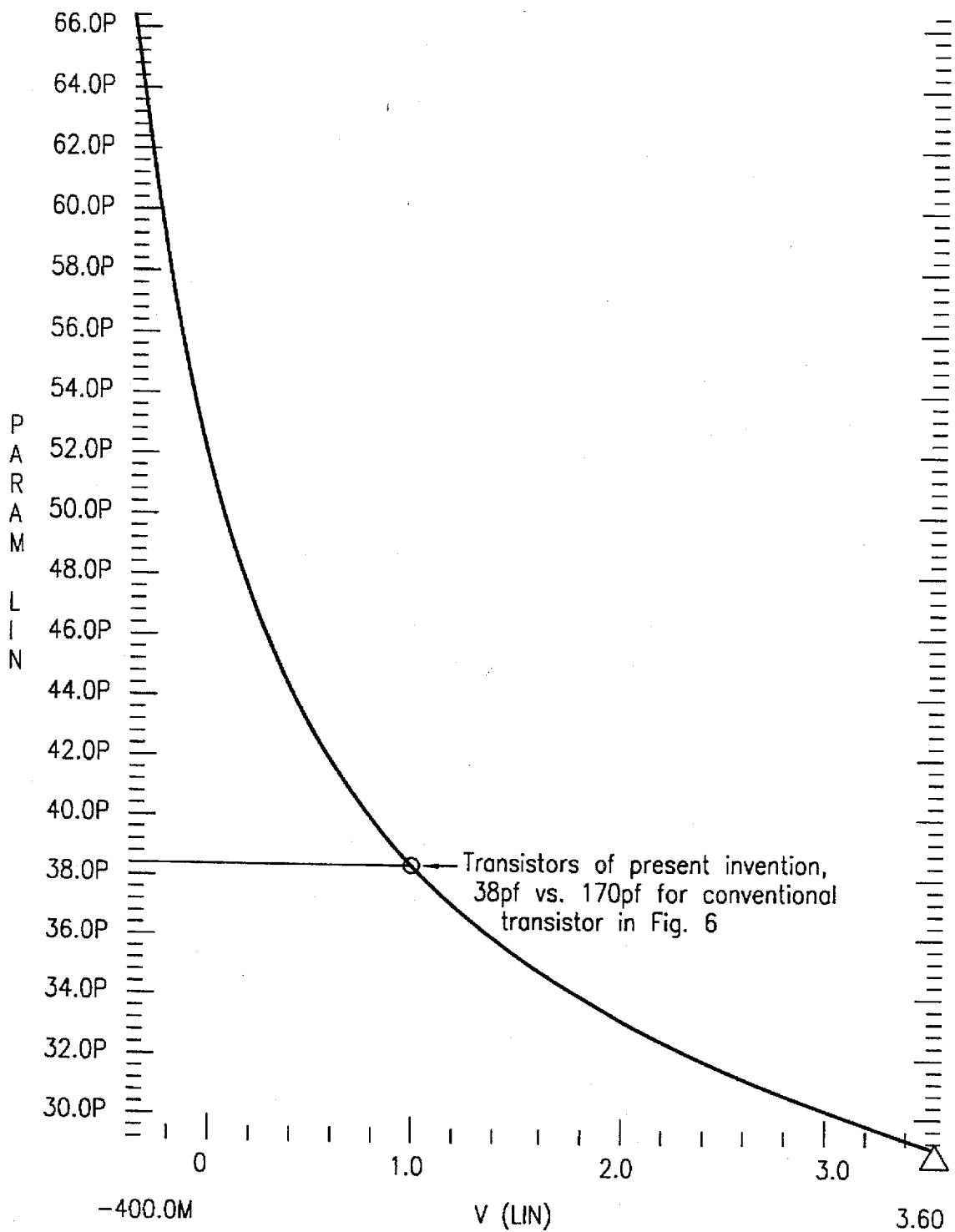
Figure 8:
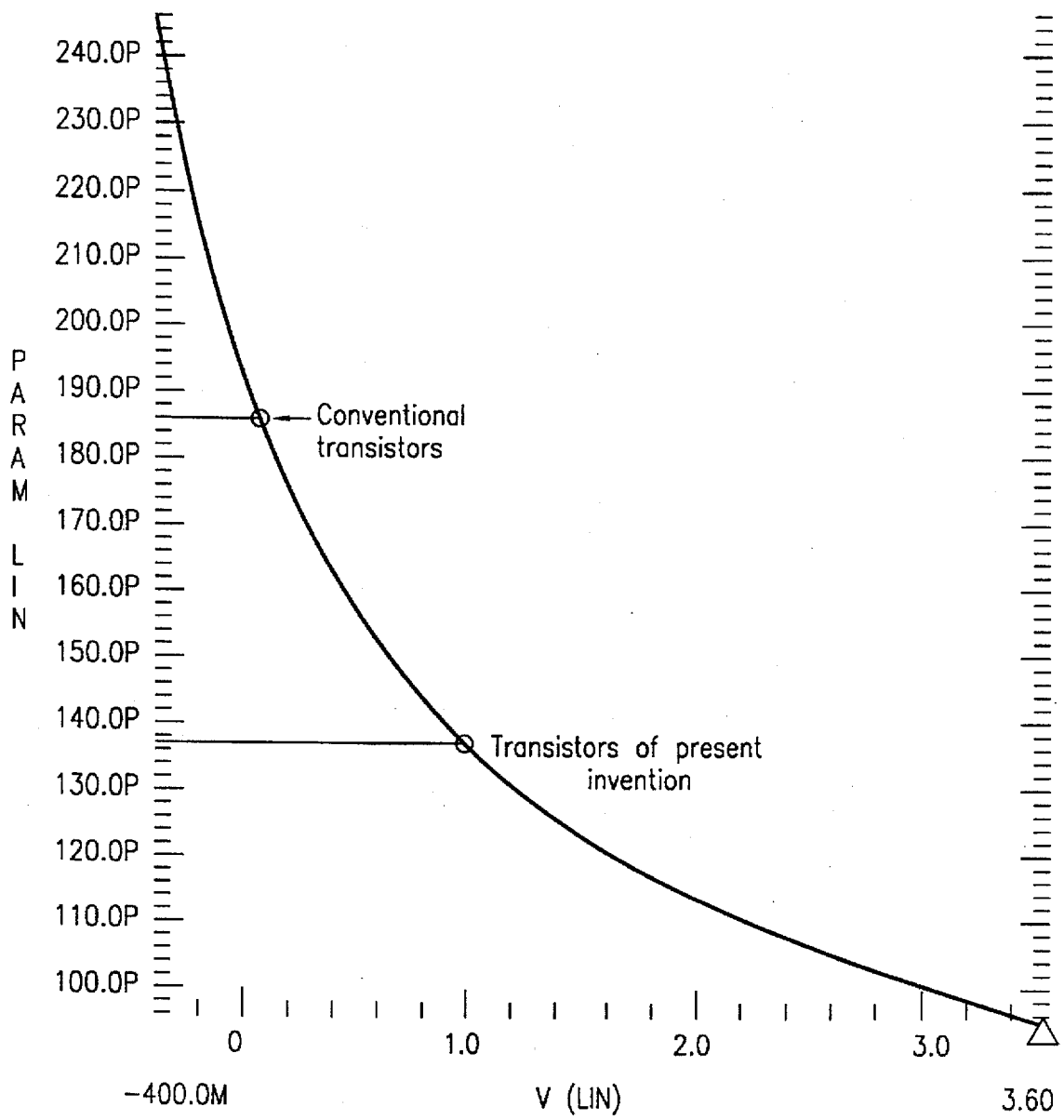
FIG. 8 is a graph of the area junction capacitances for conventional transistors without back bias and annular transistors with a back bias of 1 volt according to the present invention.

FIGS. 6, 7 and 8 illustrate graphically the difference in performance of transistors of the prior art and that of annular transistors according to the present invention. Specifically, FIG. 6 shows that an undesirably high finger junction capacitance exists at the interface between the source and drain regions and the field oxide regions in conventional annular transistors. A comparison of FIG. 7 with FIG. 6 exemplifies the dramatic reduction in junction capacitance using an annular transistor according to the present invention having an outside polysilicon ring and with an applied back-bias of 1 volt.

Similarly, FIG. 8 illustrates the difference in performance of in terms of area junction capacitance between conventional transistors and those according to the present invention. Conventional transistors have a considerably higher area junction capacitance (~186.0 pF) compared to annular transistors according to this invention (137.0 pF) with a 1 volt back bias and outer polysilicon annulus.

While the present invention is disclosed with reference to the preferred embodiments and examples detailed above, it is to be understood that these examples are intended in an illustrative rather than limiting sense, as it is contemplated that many modifications within the scope and spirit of the invention will readily occur to those skilled in the art and the appended claims are intended to cover such variations.

We claim:

1. A MOSFET, comprising:
   a source formed in a semiconductor substrate and having a perimeter;
   a drain formed concentrically about said source in said substrate and having an annular shape to form a channel with said source;
   a polysilicon gate electrode having an annular shape disposed peripherally about said source;
   a polysilicon annulus for isolating said drain from field oxide, wherein an inner perimeter of said polysilicon annulus overlies an outer perimeter of said drain.

2. A MOSFET according to claim 1, wherein threshold voltage of said gate electrode is defined by a back-bias applied to said substrate without degrading drain current.

3. A MOSFET according to claim 1, wherein cross sections of said annular drain, said annular gate electrode and said annular polysilicon region are rectangular.

4. A MOSFET according to claim 1, wherein cross sections of said annular drain, said annular gate electrode and said annular polysilicon region are circular.

5. A MOSFET, comprising:
   a source;
   a drain having an annular shape and being spaced from said source to form a conductive channel with said source;
   a gate electrode having an annular shape and formed on and insulated from said channel; and
   a polysilicon annulus for isolating said drain from field oxide, wherein an inner circumference of said polysilicon annulus overlies an outer circumference of said drain.

6. A MOSFET according to claim 5, wherein threshold voltage of said gate electrode is defined by a back-bias applied to a substrate in which said source and said drain are formed without degrading drain current.

7. A MOSFET according to claim 5, wherein cross sections of said annular drain, said annular gate electrode and said annular polysilicon region are rectangular.

8. A MOSFET according to claim 5, wherein cross sections of said annular drain, said annular gate electrode and said annular polysilicon region are circular.

9. A MOSFET, comprising:
   a source formed in a semiconductor substrate and having a circumference;
   a drain formed concentrically about said source in said substrate and having an annular shape to form a channel with said source;
   a polysilicon gate electrode having an annular shape disposed peripherally about said source;
   a polysilicon annulus for isolating said drain from field oxide, wherein an inner circumference of said polysilicon annulus overlies an outer circumference of said drain.

10. A MOSFET according to claim 9, wherein threshold voltage of said gate electrode is defined by a back-bias applied to said substrate without degrading drain current.

11. A MOSFET according to claim 9, wherein cross sections of said annular drain, said annular gate electrode and said annular polysilicon region are rectangular.

12. A MOSFET according to claim 9, wherein cross sections of said annular drain, said annular gate electrode and said annular polysilicon region are circular.

* * * * *